United States Patent [19]
Jinbo et al.

[11] Patent Number: 5,324,600
[45] Date of Patent: Jun. 28, 1994

[54] METHOD OF FORMING RESIST PATTERN AND PHOTOMASK THEREFOR

[75] Inventors: Hideyuki Jinbo; Yoshiyuki Kawazu; Yoshio Yamashita, all of Tokyo, Japan

[73] Assignee: Oki Electric Industry Co., Ltd., Tokyo, Japan

[21] Appl. No.: 909,994

[22] Filed: Jul. 7, 1992

[30] Foreign Application Priority Data

Jul. 12, 1991 [JP] Japan .................................. 3-172105
Jul. 12, 1991 [JP] Japan .................................. 3-172106
Sep. 5, 1991 [JP] Japan .................................. 3-252889

[51] Int. Cl.⁵ .............................................. G03F 9/00
[52] U.S. Cl. ........................................ 430/5; 430/311
[58] Field of Search ................ 430/5, 22, 269, 311, 430/396; 378/34, 35

[56] References Cited
U.S. PATENT DOCUMENTS 4,890,309 12/1989 Smith et al. ........................ 378/35
5,045,417 9/1991 Okamoto ............................. 430/5

Primary Examiner—Steve Rosasco
Attorney, Agent, or Firm—Spencer, Frank & Schneider

[57] ABSTRACT

In a photomask for use in forming a resist pattern by projection exposure of a resist through the photomask, a phase shifter has a first edge part whose image is to be transferred and a second edge part whose image is not to be transferred. A light attenuator is provided to cover the first edge part. The light attenuator may include an array of opaque stripes arranged at a pitch of not more than the limit of resolution, i.e., $0.5 \times \lambda/NA$, where $\lambda$ represents the wavelength of light used for the projection exposure, and NA represents the numerical aperture of an optical system used for the projection exposure. In another embodiment, the light attenuator is formed to cover a shifter edge part in alignment with a line of a transmission mask. In a further embodiment, one or more light attenuators having different transparency are used to obtain lines of a resist pattern having different widths.

44 Claims, 14 Drawing Sheets

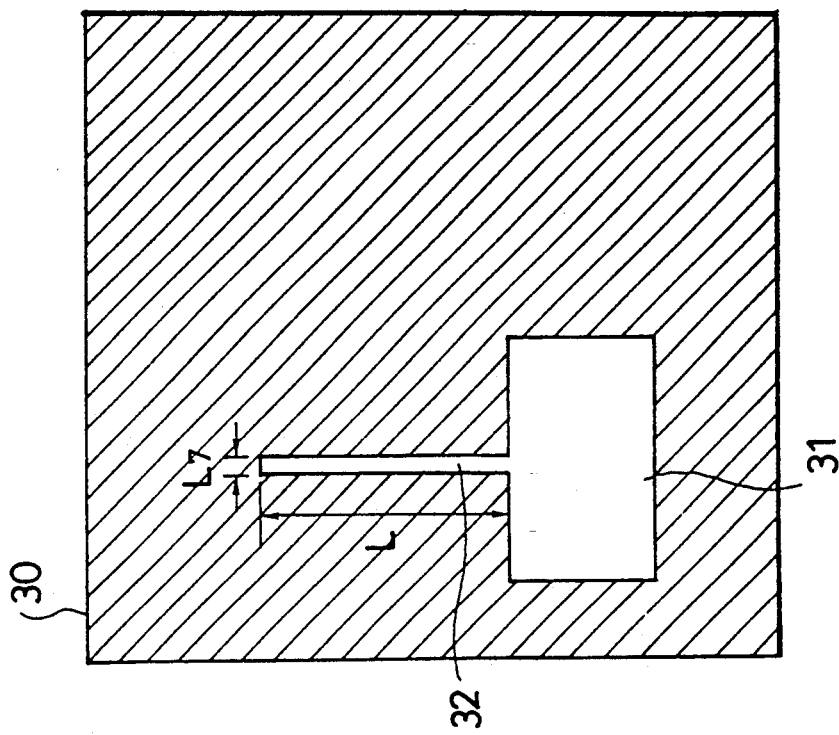
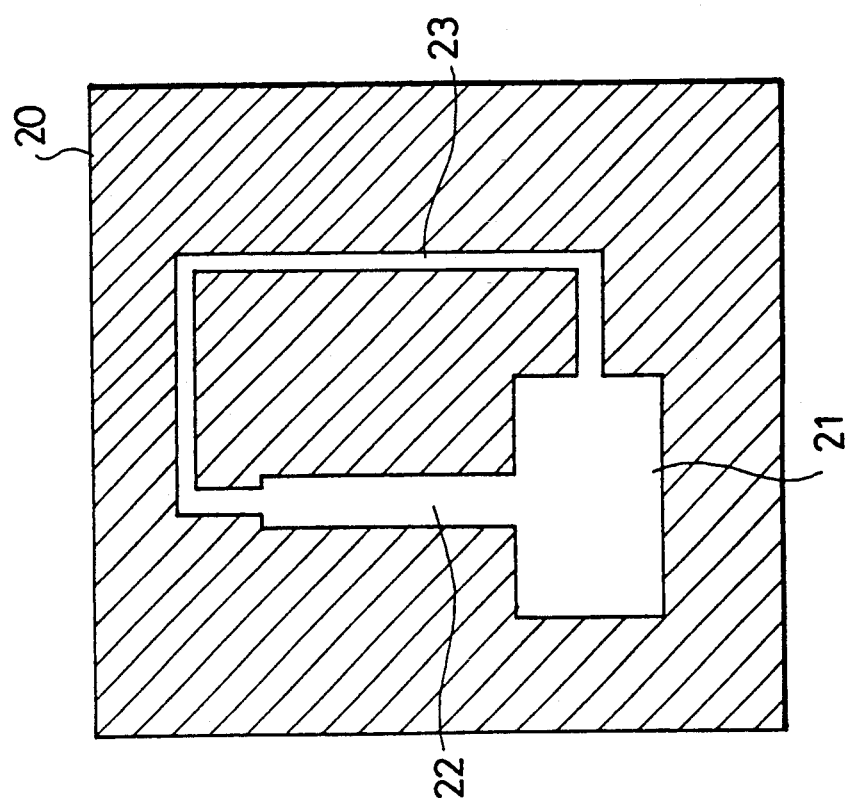

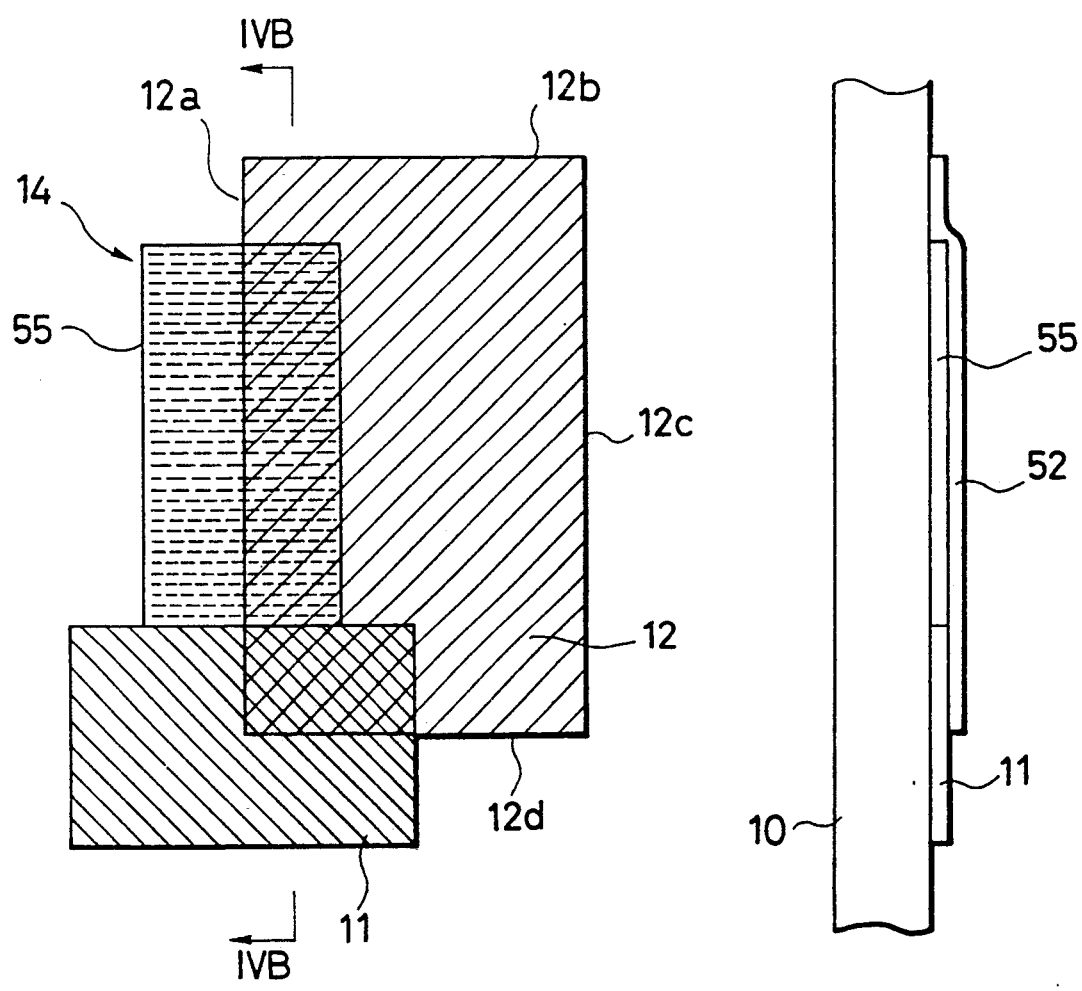

METHOD OF FORMING RESIST PATTERN AND PHOTOMASK THEREFOR

BACKGROUND OF THE INVENTION

The present invention relates to a method of forming a resist pattern by projection exposure employed in a process of fabricating semiconductor devices, and in particular to photomasks used in such a method.

In optical lithography by projection exposure, various methods have been proposed which can form fine resist patterns to cope with the increase of the packing density of the semiconductor devices. One technique drawing attention is the phase-shifting mask method.

The phase-shifting mask method is disclosed in Japanese Patent Kokoku Publication No. S62-59296.

In the phase-shifting mask method, a phase-shifter in the form of a transparent thin film which shifts the phase of light passing therethrough is disposed partially over a photomask. At the edge of the phase-shifter (the boundary between the area covered by the phase-shifter and the area not covered), the light which passed through the phase-shifter and the light which did not pass through the phase-shifter are 180° out of phase from each other, interfere with each other, and lower the light intensity on the wafer, so that the part of the resist along the edge of the phase-shifter is effectively "unexposed" to the light. By the use of the phase-shifter, the resolution of the projection exposure method is improved.

It is however necessary to provide a measure to eliminate the undesired lines of the resist pattern corresponding to edges of the phase shifter whose images are not desired to be transferred. One measure is to use two photomasks, a first one having the phase shifter, and a second one having an opaque pattern of a transmission mask uncovering the undesired part of the edges of the phase shifter, so that the part of the resist corresponding to the undesired part of the phase shifter edge is exposed during the exposure using the second photomask. This method has shortcomings in that the number of exposure steps as well as the number of photomasks are increased.

Another problem with the prior art phase shifter method is that resist pattern having lines with different width could not obtained.

SUMMARY OF THE INVENTION

An object of the invention is to eliminate the need of two photomasks or two exposure steps.

Another object of the invention is to enable formation of a resist pattern having lines of different widths.

A photomask according to the invention comprises a phase shifter having a first edge part which is to be transferred and a second edge part which is not to be transferred. A light attenuator is provided to cover the first edge. The light attenuator may comprise an array of opaque stripes arranged at a pitch of not more than the limit of resolution, i.e., $0.5 \times \lambda/NA$, where $\lambda$ represents the wavelength of light used for the projection exposure, and NA represents the numerical aperture of an optical system used for the projection exposure. In another embodiment, the light attenuator is formed to cover a shifter edge part in alignment with a line of a transmission mask. In a further embodiment, one or more light attenuators having different transparency are used to obtain lines of a resist pattern having different widths.

BRIEF DESCRIPTION OF THE DRAWINGS

FIGS. 2A and 2B show the resist pattern obtained through exposure using the photomask of FIG. 1A.

FIG. 4A is a plan view showing a mask pattern of a photomask of an embodiment of the invention.

FIG. 4B is a sectional view along line IVB—IVB in FIG. 4A.

DETAILED DESCRIPTION OF THE PREFERRED EMBODIMENTS

Various embodiments of the invention will now be described with reference to the drawings.

The photomasks of the embodiments are used for projection exposure in which the mask pattern is projected, being reduced, onto a resist on the surface of a semiconductor wafer, and the dimensions of various parts of the mask patterns of the photomasks are the dimensions as projected on the wafer (or the resist on the surface of the wafer).

Plan view of the photomasks are schematic in nature and do not indicate which layer is above or below another layer, but illustrate how the layers overlap each other or are related in the direction of the plane of the substrate.

For the projection exposure, light of wavelength of 365 nm is used, and the numerical aperture of the optical system used for the exposure is 0.42 unless otherwise specified.

Figure 1A:
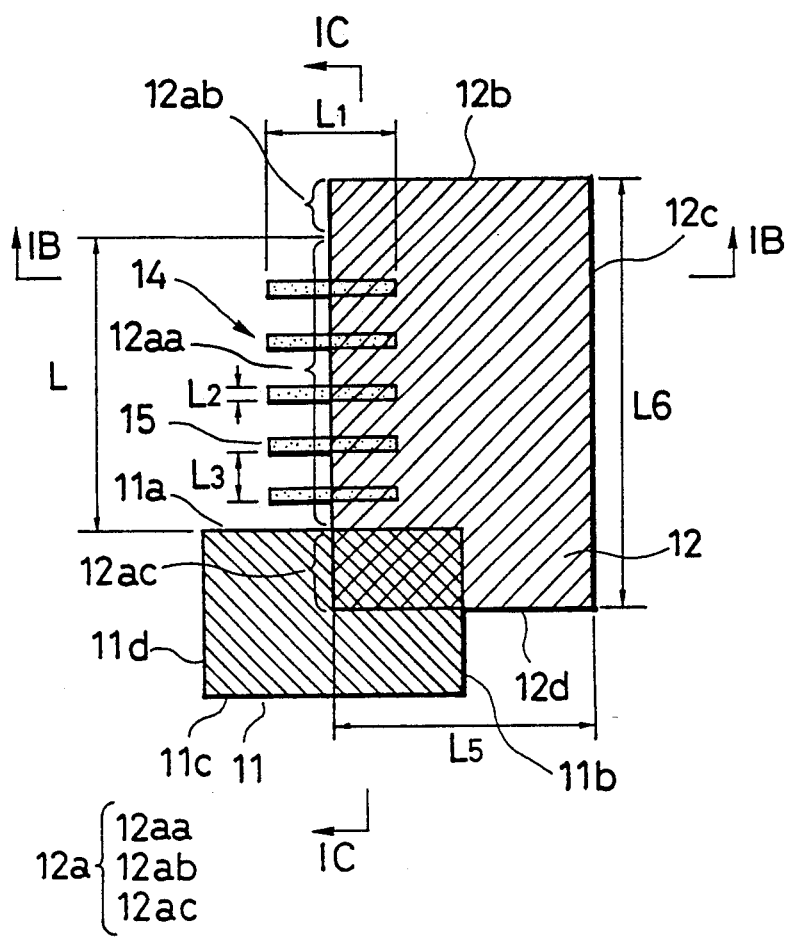
FIG. 1A is a plan view showing a mask pattern of a photomask of an embodiment of the invention.
Figure 1C:
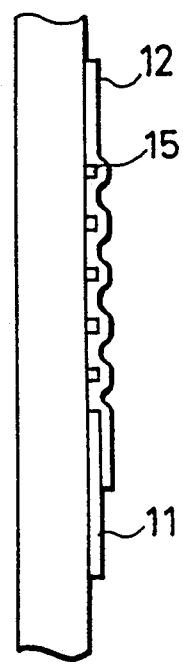
FIG. 1C is a sectional view along line IC—IC in FIG. 1A.
Figure 1B:
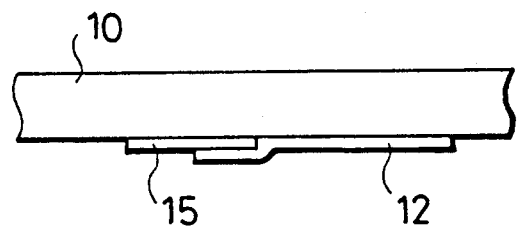
FIG. 1B is a sectional view along line IB—IB in FIG. 1A.

FIGS. 1A to 1C show a photomask pattern for forming a gate pattern according to a first embodiment of the invention.

As illustrated, a rectangular opaque pattern 11 of chrome, for example, forming a transmission mask, and a phase shifter 12 are provided on a transparent area of a mask substrate 10. The phase shifter 12 is rectangular and has first to fourth edges 12a, 12b, 12c and 12d. A part 12aa (the entirety except the tip part 12ab and the part 12ac overlapping the opaque part 11) of the first edge 12a is utilized for the formation of the gate pattern. The second to fourth edges 12b to 12d and edge parts 12ab and 12ac are unnecessary for the formation of the desired gate pattern.

A light attenuator 14 extends, in the direction of the edge 12a, to cover the edge part 12aa and extends, in the direction perpendicular to the edge 12a, over a certain dimension or width centered on the edge 12a. For instance, the width of the light attenuator 14 is 1 μm. The light attenuator 14 extends on both sides of the edge 12a by the same dimension, e.g., 0.5 μm.

In the illustrated embodiment, the light attenuator 14 comprises an array of opaque stripes 15 made for example of chrome. The opaque stripes 15 extend at a right angle with the first edge 12a, with their midpoints in the direction of their extension being aligned with the edge 12a, and arranged at a regular pitch L3.

The opaque stripes 15 are formed at a pitch not larger than the resolution of the optical system, i.e., not more than $R = 0.5 \times (\lambda \times NA)$, where NA represents numerical aperture of the optical system used for the exposure and $\lambda$ represents the wavelength of the exposure light.

The number n of stripes 15 is given by:

$$n = L/L3$$

where L represents the length of the part 12aa.

The opaque pattern 11 has first to fourth sides 11a to 11d. The first and third sides 11a and 11c are longer sides, are perpendicular to the first edge 12a of the phase shifter 12, and the first edge 12a intersects the first side 11a at the middle of the first side 11a, and form a right angle at the intersection. The section and fourth sides 11b and 11d are shorter sides, and perpendicular to the first and third sides. The fourth edge 12d of the phase shifter 12 intersects the second side 11b and form a right angle at the intersection.

For the purpose of experiments, various photomasks were prepared. The length L1 of the stripes was 1 μm; their width L2 was 0.1 μm, 0.2 μm and 0.3 μm; and the pitch L3 was 0.4 μm and 0.5 μm.

The phase shifter 12 was an electron beam resist OEBR-100 (Tokyo Ohka, Japan) and had a thickness of 350 nm, and its width L5 was 2 μm and its length L6 was 4 μm.

Using the above-mentioned photomasks, the experiments for forming the resist pattern were conducted in the following manner.

First, a negative-type resist FSMR (Fuji Yakuhin, Japan) was applied to a thickness of 1 μm, by a spin-coating method on silicon substrates (wafers) having a diameter of 3 inches (3×2.56 cm).

The wafers were baked at 70° C. for 90 seconds using a hot plate.

The wafers were then placed in an i-line projection exposure device (stepper) RA101VLII (Hitachi Seisakusho, Japan), and was exposed to light, with a dose of 50 to 600 mJ/cm$^2$, using the photomasks described above.

After the exposure, the wafers were again baked at 110° C. for 90 seconds using a hot plate, and spray development for 40 seconds was conducted using an FSMR developing agent.

FIGS. 2A and 2B show the resist pattern obtained as a result of the development. FIG. 2A shows the case where the dose was 200 mJ/cm$^2$. FIG. 2B shows the case where the dose was 300 mJ/cm$^2$.

In the case shown in FIG. 2A, images of all the edges 12a to 12d of the phase shifter 12 were transferred. That is, not only the "unexposed" part 21 corresponding to the opaque pattern 11 and the unexposed part 22 corresponding to the part 12aa of the edge 12a of the phase shifter 12, but also the unexposed part 23 corresponding to the edges 12c to 12d and the tip part 12ab of the first edge 12a was formed. It is, however to be noted that the unexposed part 22 was wider than the unexposed part 23. This is due to attenuation of the light at the areas corresponding to the edge part 12aa.

In the case shown in FIG. 2B, the dose of exposure was large enough to eliminate the lines of the resist pattern corresponding to the edge part 12ab and the edges 12b to 12d. That is, the edge part 12aa is transferred, while the edge part 12ab and the other edges 12b to 12d are not transferred.

The width L7 of the unexposed part 32 was related to the width L2 and the pitch L3 of the stripe shaped patterns 15.

(1) When L2=0.1 μm and L3=0.4 μm, L7 was 0.17 μm;

(2) When L2=0.2 μm and L3=0.4 μm, L7 was 0.25 μm;

(3) When L2=0.1 μm and L3=0.5 μm, L7 was 0.15 μm;

(4) When L2=0.2 μm and L3=0.5 μm, L7 was 0.22 μm; and (5) When L2=0.3 μm and L3=0.5 μm, L7 was 0.35 μm.

It was thus confirmed that the unexposed part having a width L7 of about 0.15 to 0.3 μm was formed through a single exposure.

The transparency of the light attenuator can be adjusted by the width of the opaque stripes or the pitch of the opaque stripes.

Figure 3:
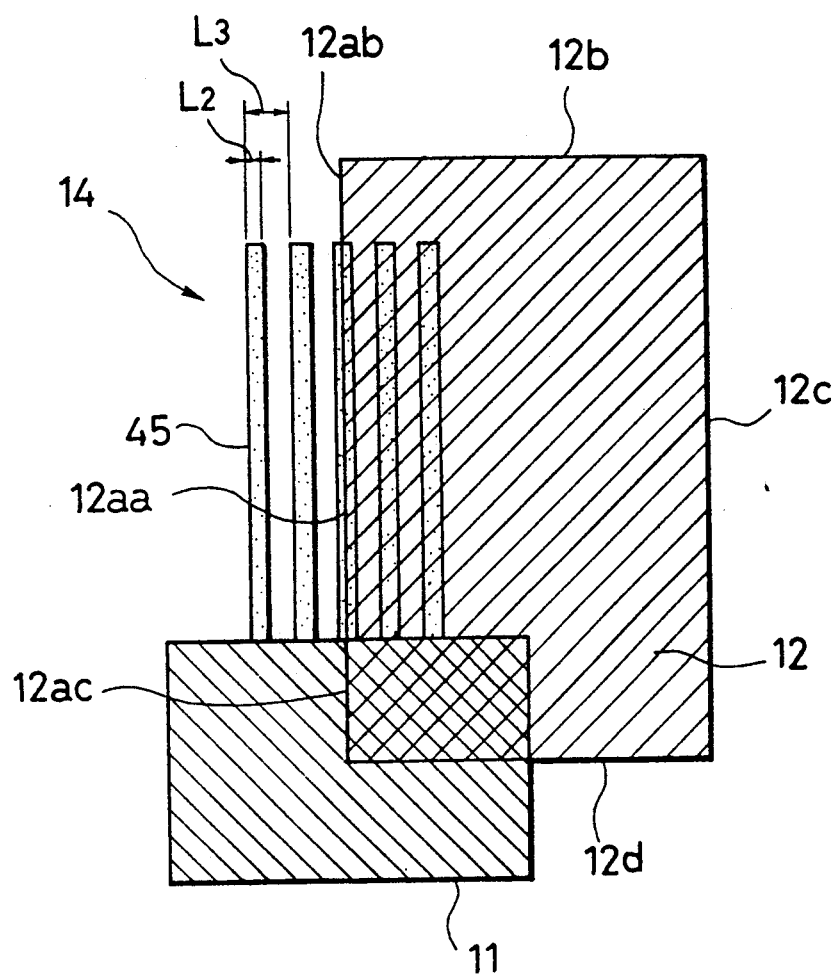
FIG. 3 is a plan view showing a mask pattern of a photomask of another embodiment of the invention.

FIG. 3 shows a photomask pattern used for gate pattern formation according to a second embodiment of the invention.

In this embodiment, the light attenuator 14 is formed of an array of opaque stripes 45, which are similar to those shown in FIG. 1, but which extend parallel with the edge 12a of the phase shifter 12.

The length of the opaque stripes 45 is equal to the length of the edge part 12aa. The width of the area where the opaque stripes 45 are formed, i.e., the width of the light attenuator 14, is about 1 μm, and the center of such area in the direction perpendicular to the edge 12a is aligned with the edge 12a.

The width L2 and pitch L3 of the opaque parts 45 are equal to those of the first embodiment.

With the use of the photomask pattern shown in FIG. 3, the effects similar to those in the first embodiment are obtained.

The direction in which the opaque stripes extend may be other than those shown in FIGS. 1 and 3, i.e., it may be oblique. The essential requirement is that the opaque stripes be arranged over the area covering the edge part 12aa whose image is to be transferred.

FIGS. 4A and 4B show a photomask pattern used for gate pattern formation according to another embodiment of the invention.

In this embodiment, the light attenuator 14 comprises a thin film 55. The thin film 55 has a transparency of not more than 95%. The thin film 55 may be formed of metal, e.g., chrome, or an oxide of metal. In an example, the thin film is formed of chrome and has a thickness of 300 Angstroms.

As has been described according to the above-described embodiments, a gate pattern can be formed through a single projection exposure step by the use of the light attenuator. The light attenuator may comprise an array of opaque stripes or a thin film. The transparency can be adjusted such that with a dose of exposure resulting in a line of a desired width at an area corresponding to the phase shifter edge part which is desired to be transferred, transfer of the undesired edge parts is avoided. Where the light attenuator comprises an array of opaque stripes, the transparency can be adjusted by adjustment of the width and/or pitch of the opaque stripes. Where the light attenuator comprises a thin film the transparency can be adjusted by adjustment of the thickness of the thin film.

Figure 5A:
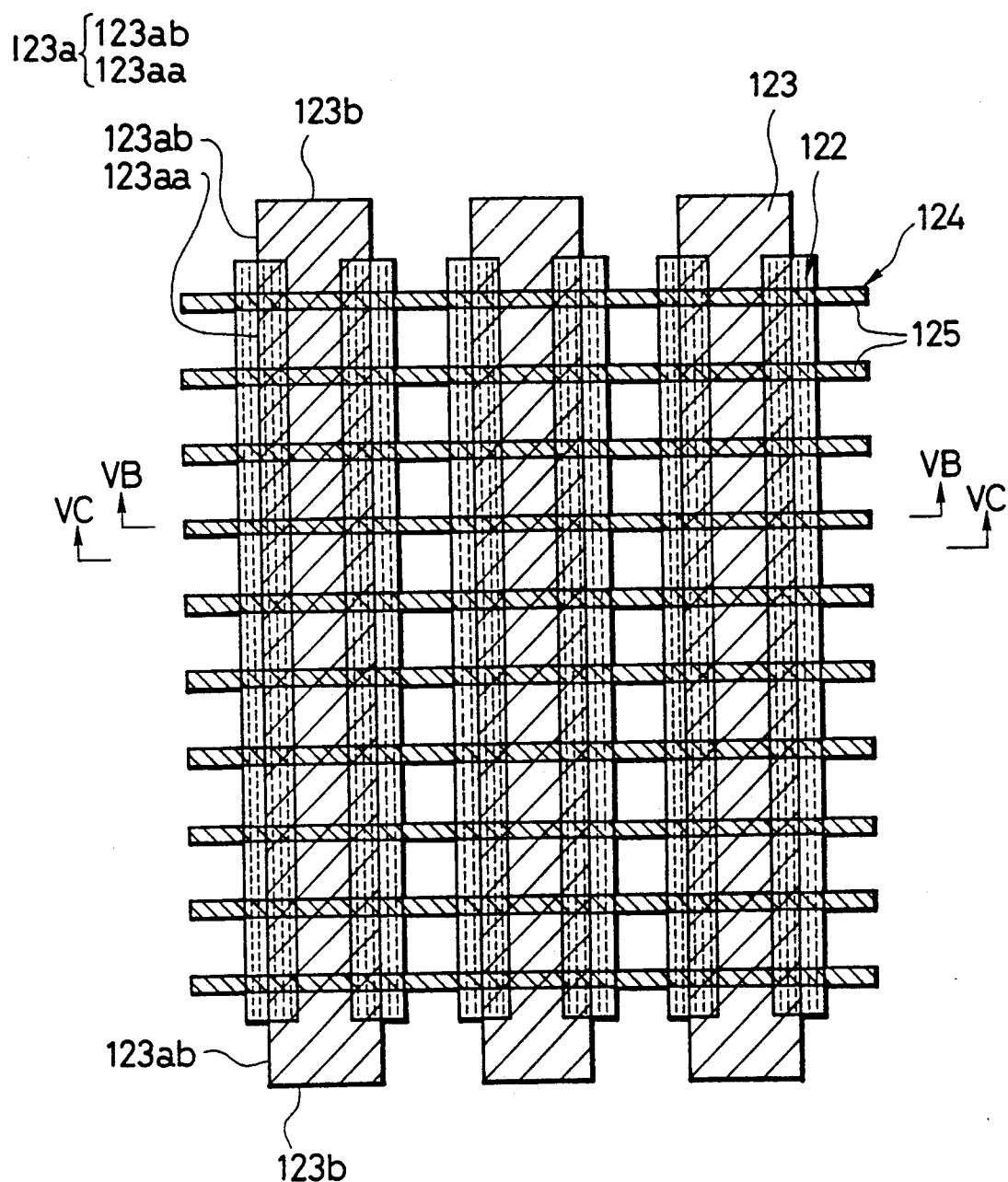
FIG. 5A is a plan view showing a mask pattern of a photomask of another embodiment of the invention.
Figure 5B:
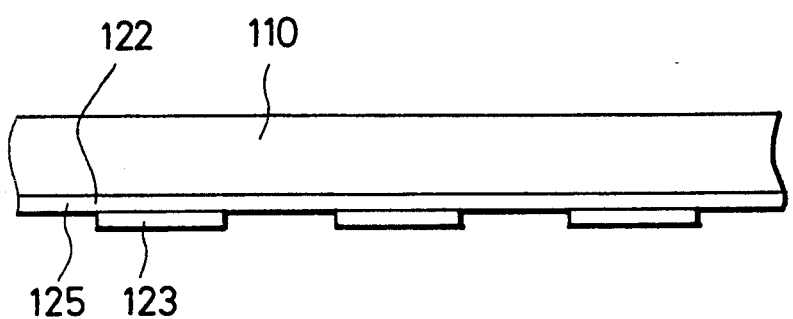
FIG. 5B is a sectional view along line VB—VB in FIG. 5A.
Figure 5C:
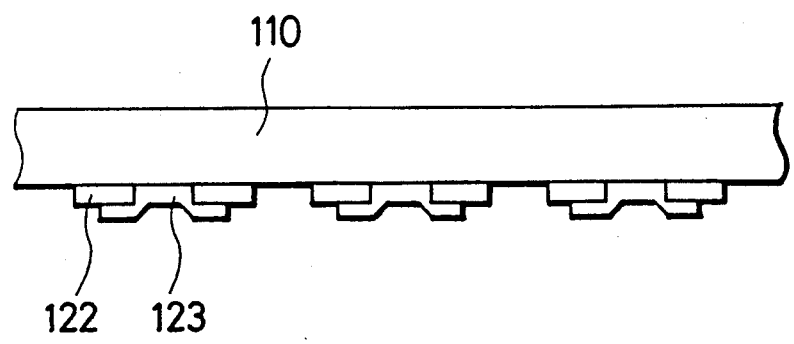
FIG. 5C is a sectional view along line VC—VC in FIG. 5A.

FIGS. 5A to 5C show a photomask pattern of another embodiment of the invention. The photomask pattern of this embodiment is for use in formation of a line-and-space pattern for positive-type resist.

The photomask of this embodiment comprises a mask substrate 110, an array of opaque lines 122 formed for example of chrome, an array of band-shaped phase shifters 123, and a light attenuator 124. The opaque lines 122 form a transmission mask having a line-and-space pattern, with lines disposed at an equal pitch. The array of band-shaped phase shifters 123 are provided so that their parallel edges 123a are in alignment with the centers of the opaque lines 122.

More specifically, each of the band-shaped phase shifters 123 has a first pair of parallel edges 123a, and a second pair of parallel edges 123b. The width of each phase shifter, i.e., the distance between its first pair of parallel edges 123a, is equal to the pitch of the opaque lines 123. The phase shifters 123 are disposed at a pitch twice that of the opaque lines 122, so that opposite or confronting edges 123a of the adjacent phase shifters 123 are in alignment with the centers of the opaque lines 122 adjacent to each other.

The first pair of edges 123a of each phase shifter 123 are longer than the opaque lines 122 and protrude beyond both ends of the opaque lines 122. The first edges 123a thus have first parts 123aa covered by or overlapping with the opaque lines 122, and second parts 123ab which lie beyond the ends of the opaque lines 122. The edge parts 123aa are desired to be transferred to the resist pattern, while transfer of the edge parts 123ab and the edges 123b is not desired.

The function of the phase shifters 122 is to increase the resolution of the line-and-space pattern. The theory by which the resolution is increased is described, for example, in Levenson et al.: "Improving Resolution in Photolithography with a Phase-Shifting Mask", IEEE Transactions on Electron Devices, Vol. ED—29, No. 12, December 1982.

The side effect of the use of the phase shifters is that the light intensity is also lowered at areas corresponding to the edges 123b and the edge parts 123ab, and lines of "unexposed part" may also be created in the resultant resist pattern at the areas corresponding to the undesired edges 123b and the undesired edge parts 123ab.

The light attenuator 124 covers the area over which the opaque lines 122 are provided, i.e., the area over which the first parts 123aa of the parallel edges 123a of the phase shifters 123 extend. The function of the light attenuator 124 is to lower the intensity of light as projected on the wafer in the area covered by the light attenuator to introduce a difference in the density of projected light between the light-transmissive areas situated between the opaque lines 122, and the areas corresponding to the undesired edges 123b and edge parts 123ab. By the difference in the projected light intensity, it is possible to ensure image transfer of the opaque lines 122, while preventing image transfer of the image of the edges 123b and edge parts 123ab. The light attenuator 124 of the illustrated embodiment comprises an array of opaque stripes 125, formed for example of chrome, parallel with each other and arranged at a pitch not larger than the resolution of the optical system of the exposure device, i.e., not larger than $0.5 \times (\lambda/NA)$, where $\lambda$ represents the wavelength of light used for the exposure projection, and NA represents the numerical aperture of the optical system.

In the illustrated embodiment, the opaque stripes 125 extend normal to the edges 123a of the phase shifters 23.

The opaque stripes 125 for the light attenuation may be formed simultaneously with the opaque lines 122. This will avoid increase in the number of process steps, and hence increase in the cost of fabrication.

Figure 6:
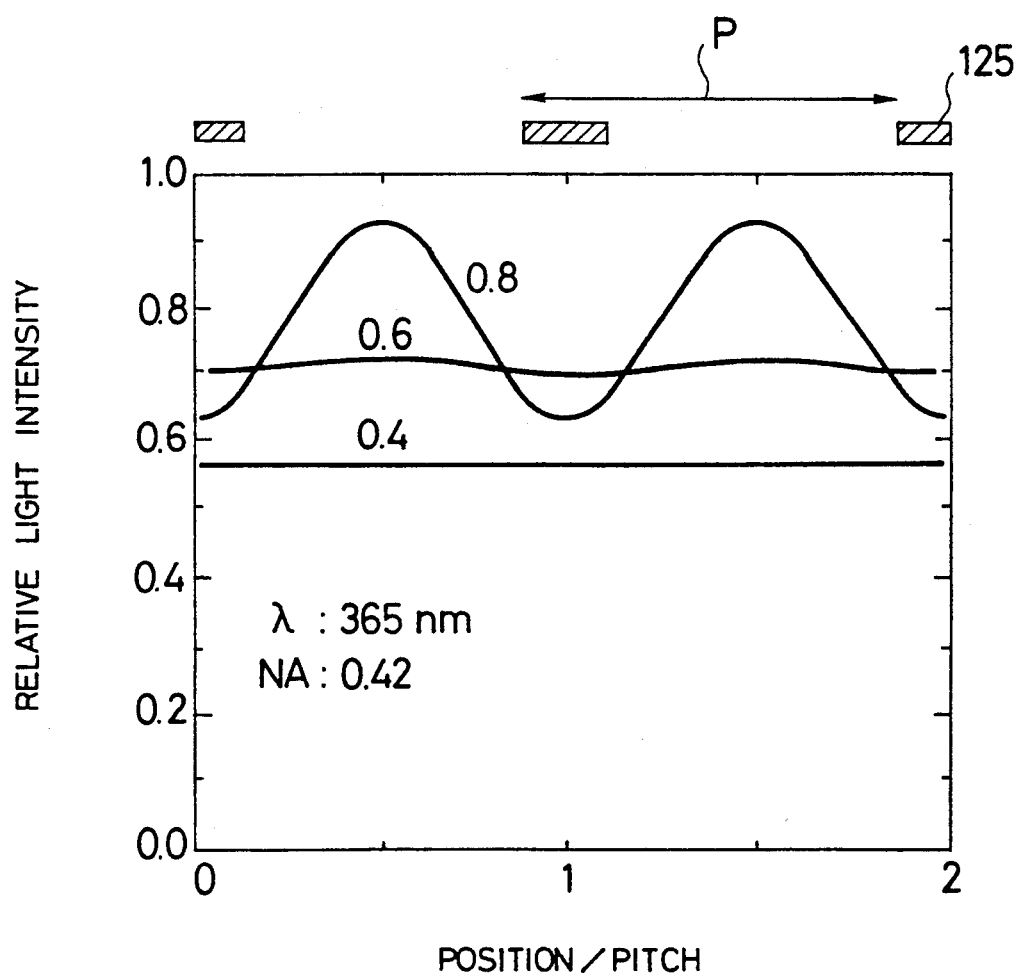
FIG. 6 is a graph showing the light intensity distribution on the wafer for different pitches of the opaque stripes.

Consideration on the pitch of the opaque stripes 125 will be given below:

FIG. 6 shows several light intensity distributions on the wafer obtained by simulation. In this example, width of the stripes 125 is assumed to be 0.1 $\mu$m, and the projection is assumed to be made using an i-line projection exposure device having a numerical aperture NA of 0.42. The pitch of the stripes is assumed to be 0.8, 0.6 and 0.4 $\mu$m. It will be seen that: when the pitch is 0.8 $\mu$m, the light intensity is not uniform; when the pitch is 0.6 $\mu$m, the light intensity is substantially uniform; and when the pitch is 0.4 $\mu$m, the light intensity is perfectly uniform.

A photomask like that shown in FIG. 5 was prepared and used to form a 0.3 $\mu$m line-and-space pattern.

The opaque lines 122 of chrome were 0.3 $\mu$m wide on the wafer, and arranged with 0.3 $\mu$m interval. The phase shifters 123 had a width of 0.6 $\mu$m. An array of opaque stripes 125 of chrome having a width of 0.1 $\mu$m and arranged at a pitch of 0.5 $\mu$m were additionally provided.

Patterning was made using this photomask. The projection exposure device used was i-line stepper RA101-VLII (Hitachi Seisakusho, Japan) having a numerical aperture of 0.42. A positive-type resist PFR-TT15 (Nihon Gosei Gomu, Japan) was applied to a thickness of 1 $\mu$m on 3-inch silicon wafers, and the silicon wafers were then baked at 90° C. for 60 seconds. The wafers were then exposed using the above-mentioned photomask, for various exposure time, 0.2 seconds, 0.4 seconds, 0.6 seconds, 0.8 seconds and 1.0 second. After the exposure, the wafers were baked at 110° C. for 90 seconds, and then were subjected to puddle development for 60 seconds, using a developer NMD-W (Tokyo Ohka, Japan).

Figure 7:
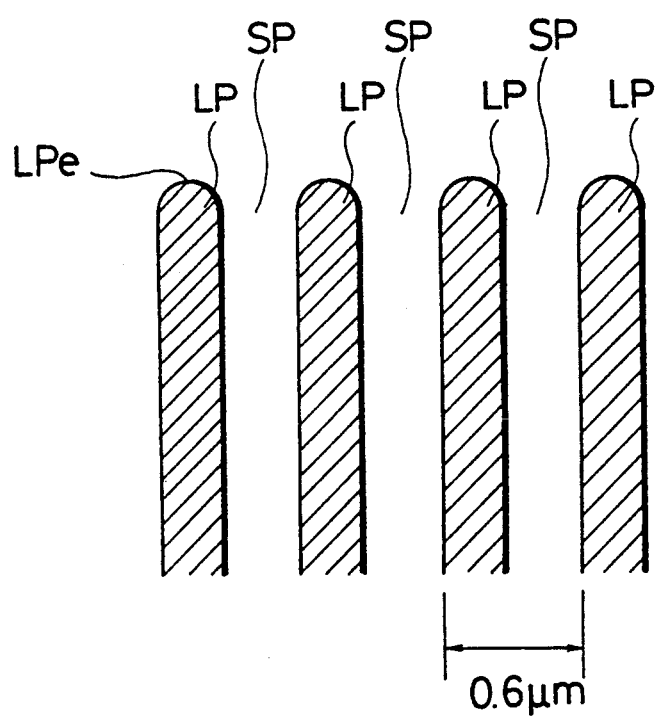
FIG. 7 is a diagram showing the resist pattern obtained through exposure using the photomask of FIG. 5A.

SEM (scanning electron microscopy) observation revealed that with the 0.8 second exposure, 0.3 μm line-and-space pattern was obtained, without image transfer of the undesired edges and edge parts of the phase shifters, as shown in FIG. 7, in which LP denotes line patterns and SP denotes space patterns. The upper ends LPe of the line patterns LP correspond to the upper ends of the edge parts 123aa.

The light attenuator used in the above embodiment comprises an array of opaque stripes. It may alternatively comprise a thin film similar to the one described with reference to the embodiment of FIG. 4.

As has been described, according to the above-described embodiment, in the formation of a line-and-space pattern of a positive type resist using the projection exposure, a light attenuator is applied over the area where the image of the opaque lines and the overlapping edges of the phase shifters is to be transferred, so image transfer of these areas is ensured, while image transfer of the undesired edges and undesired edge parts is avoided.

Moreover, if the opaque stripes of the light attenuator are formed of the same material, the light attenuator can be formed simultaneously with the opaque lines, so that the number of process steps is not increased, and the cost of fabrication is not increased.

The line-and-space pattern can be formed through a single projection exposure step by the use of the light attenuator. As an alternative to the array of opaque stripes, the light attenuator may comprise a thin film. The transparency can be adjusted such that with a dose of exposure resulting in a line of a desired width at an area corresponding to the phase shifter edge parts which are desired to be transferred, transfer of the undesired edge parts is avoided. Where the light attenuator comprises an array of opaque stripes, the transparency can be adjusted by adjustment of the width and/or pitch of the opaque stripes.

FIG. 8 shows a photomask used in another embodiment of the invention.

The photomask of this embodiment utilizes a light attenuator to form a resist pattern having lines with different widths. As illustrated, it comprises band-shaped phase shifters 211 having parallel edges 211a, 211b, and 211c formed on a mask substrate 210. The upper and lower ends which are orthogonal to the parallel edges 211a to 211c are not illustrated. First edges or first group of edges 211a are not covered by a light attenuator. The second edges or second group of edges 211b are covered by a first type of light attenuator 213. The third edges or the third group of edges 211c are covered by a second type of light attenuator 215.

The first type of light attenuator 213 may comprise an array of opaque stripes 214 of for example chrome, extending in the direction normal to the respective edges 211b of the phase shifters 211, each having a width of 0.1 μm and arranged at a pitch of 0.4 μm. The second type of light attenuator 215 may comprise an array of opaque stripes 216 of for example chrome, each having a width of 0.2 μm and arranged at a pitch of 0.4 μm.

The pitch of the opaque stripes 214 and 216 of the light attenuators 213 and 215 is so determined as not to exceed the resolution of the optical system, i.e., not more than $R=0.5\times(\lambda\times NA)$, where NA represents numerical aperture of the optical system used for the exposure and λ represents the wavelength of the exposure light. Where the wavelength is 365 nm and the NA is 0.42, the pitch of 0.4 μm satisfy the above requirement.

When the above requirement is satisfied, the image of the opaque stripes 214 and 216 is not resolved, and the light intensity is lowered uniformly throughout the area over which the opaque stripes are provided. In other words, attenuation of the intensity of exposure light on the wafer due to the light attenuator comprising the opaque stripes is uniform throughout the areas corresponding to the respective light attenuators.

Figure 8A:
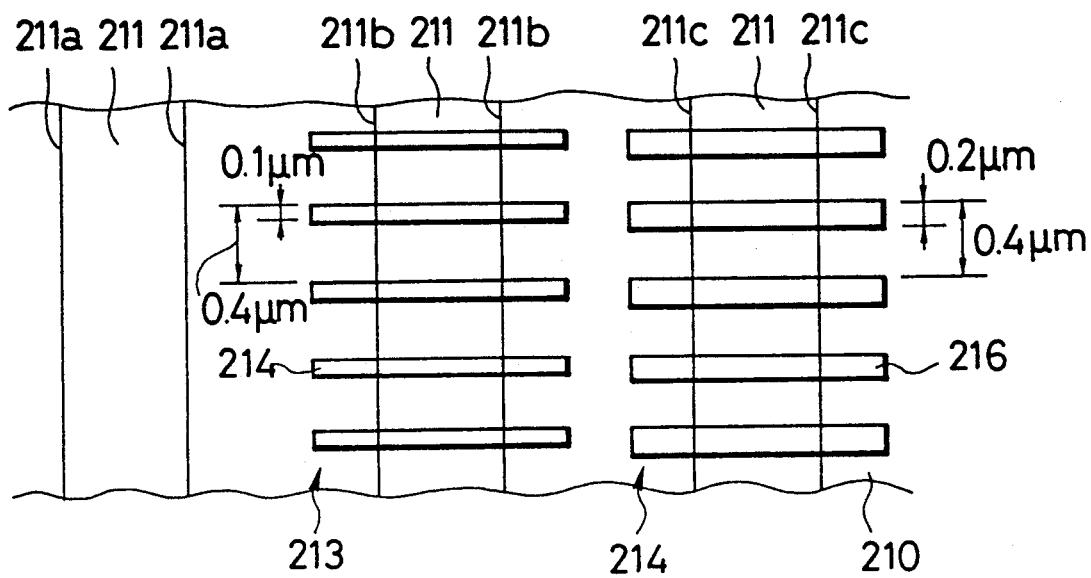
FIG. 8A is a plan view showing a mask pattern of a photomask of another embodiment of the invention.
Figure 8B:
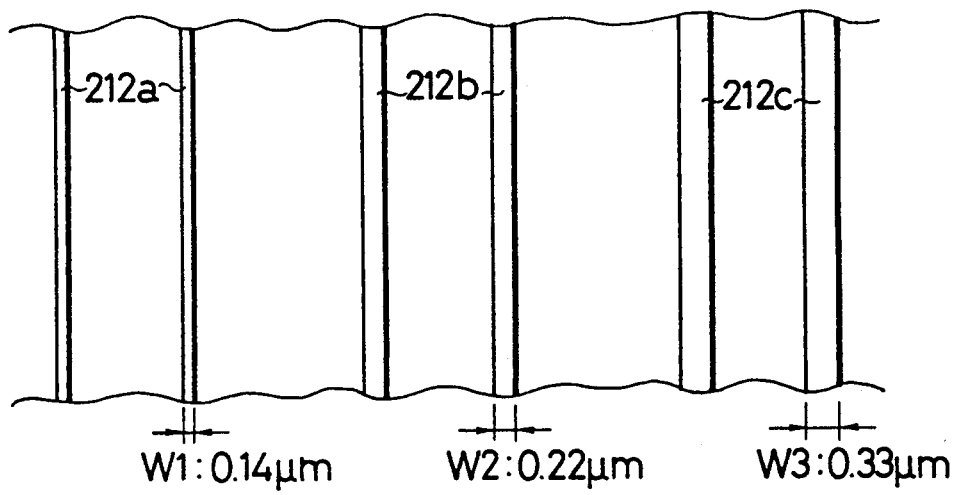
FIG. 8B is a diagram showing the resist pattern obtained through exposure using the photomask of FIG. 8A.

When, therefore, projection exposure is made using the photomask illustrated in FIG. 8A, a resist pattern, shown in FIG. 8B, can be obtained, which has first, second and third lines 212a, 212b and 212c which respectively correspond to the first, second and third edges 211a, 211b and 211c, and have a first width w1, a second width w2 larger than the first width w1, and a third width w3 larger than the second width w2.

Patterning experiments were conducted using a photomask described above.

The length (the dimension in the horizontal direction in the figure) of the opaque stripes 214 and 216 was 4 μm. The pitch of the opaque stripes was 0.4 μm, the width of the phase shifters 211 was 2 μm, and the length (the dimension in the vertical direction in the figure) of the phase shifters 211 was 10 μm.

The phase shifters were formed to a thickness of 350 nm using an electron beam resist OEBR-100 (Tokyo Ohka, Japan).

A positive-type photoresist PFR-TT-15 (Nihon Gosei Gomu, Japan) was applied to a thickness of 1 μm on silicon substrates (wafers) having a diameter of 3 inches (3×2.56 cm).

The wafers with the photoresist having been applied were baked at 100° C. for 90 seconds using a hot plate.

The wafers were then placed in an i-line projection exposure device RA101VLII (Hitachi Seisakusho, Japan), and exposed through the photomask with a dose of 100 to 1000 mJ/cm².

After the exposure, the wafers were baked at 110° C. for 120 seconds.

After the baking, puddle development for 60 seconds was conducted using a developer NMD-W (Tokyo Ohka, Japan).

The resist pattern obtained was measured using a measurement SEM S6000 (Hitachi Seisakusho, Japan).

Figure 9:
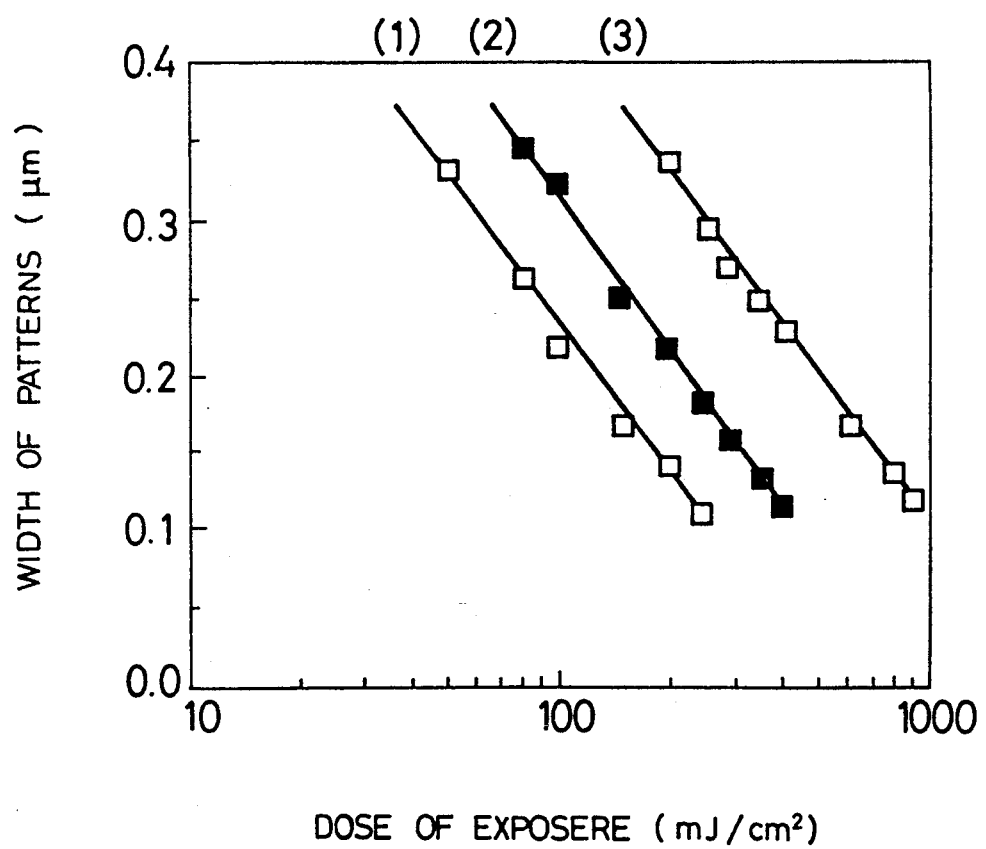
FIG. 9 is a graph showing the relationship between the width of the line of the resist pattern and the exposure dose.

The relationship between the dose and the dimension of the pattern is shown in FIG. 9.

It is seen from FIG. 9 that when the dose was 200 mJ/cm², the widths of the areas (linear area) 212a, 212b and 212c of the resist pattern corresponding to the edges 211a, 211b and 211c of the phase shifters are as follows:

(1) The linear areas 212a corresponding to the shifter edges 211a which are not covered by the opaque stripes was 0.14 μm wide, as indicated by curve (1).

(2) The linear areas 212b corresponding to the shifter edges 211b which are covered by the opaque stripes 214 of 0.1 μm wide was 0.22 μm wide, as indicated by curve (2).

(3) The linear areas 212c corresponding to the shifter edges 211c which are covered by the opaque stripes 216 of 0.2 μm wide was 0.33 μm wide, as indicated by curve (3).

Thus, it is apparent that the resist pattern of having lines 212a to 212c of different dimensions can be obtained through one and the same exposure process. The dimension of the pattern can be controlled by varying the width of the opaque stripes. Moreover, the inclination of the three curves (1) to (3) (on the logarithmic graph) are identical, so that it will be understood that the light intensity distribution is not altered by the provision of the array of opaque stripes.

Figure 10:
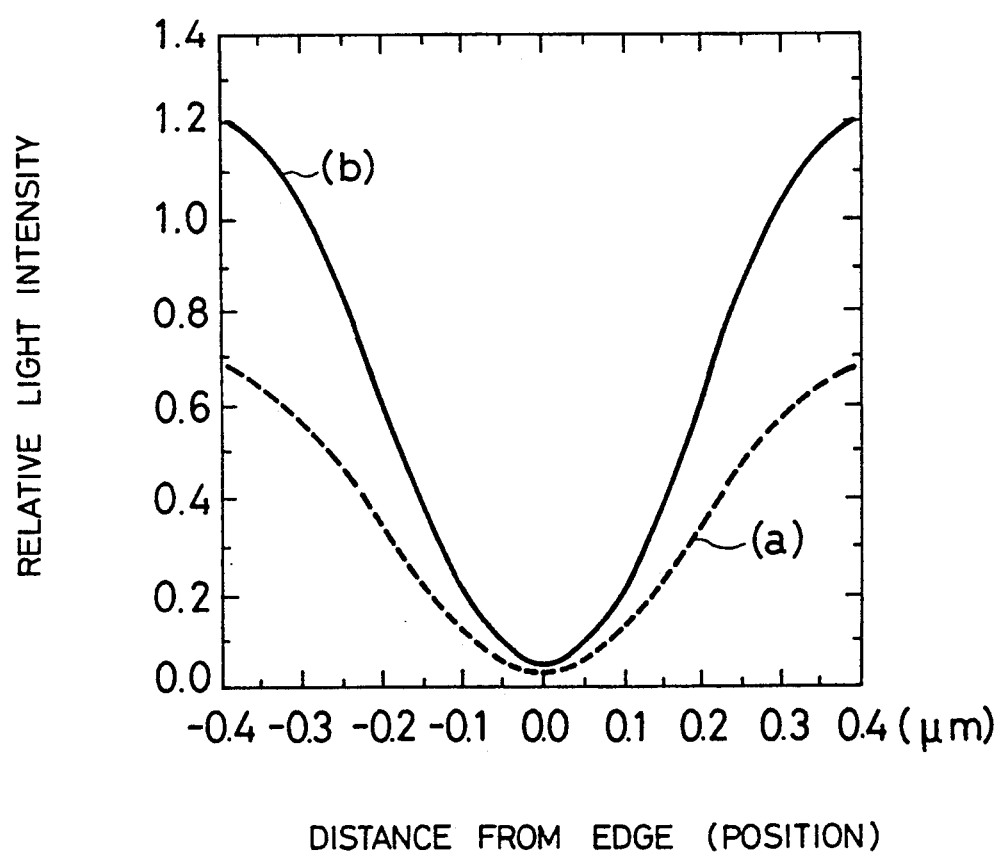
FIG. 10 is a graph showing the light intensity distributions with and without the light attenuator.

FIG. 10 shows light intensity distributions, obtained as a result of simulation, along a line perpendicular to the edge of a phase shifter in a case where the 0.1 μm opaque stripes of chrome were disposed (curve (a)) and in a case where no such opaque stripes are disposed (curve (b)).

As will be seen from FIG. 10, the ratio of the light intensity at each point between the two cases (a) and (b) is constant, and the ratio (b)/(a) is 56%. It will therefore be understood that the light attenuator consisting of the fine stripes of chrome can lower the light intensity as applied to the photoresist without modifying the light intensity distribution is retained.

In the embodiment described, the number of the lines of the resist pattern with each width was two. But any other number of lines having an identical width can be obtained. In the embodiment described, each array of the opaque stripes extend to cover two shifter edges, but it may be cover any other number of shifter edges.

In the embodiment described, the width of the lines of the resist pattern was controlled by the width of the opaque stripes. However, the width of the stripes may be kept constant, but the pitch of the opaque stripes may be changed to control the width of the lines of the resist pattern.

Figure 11:
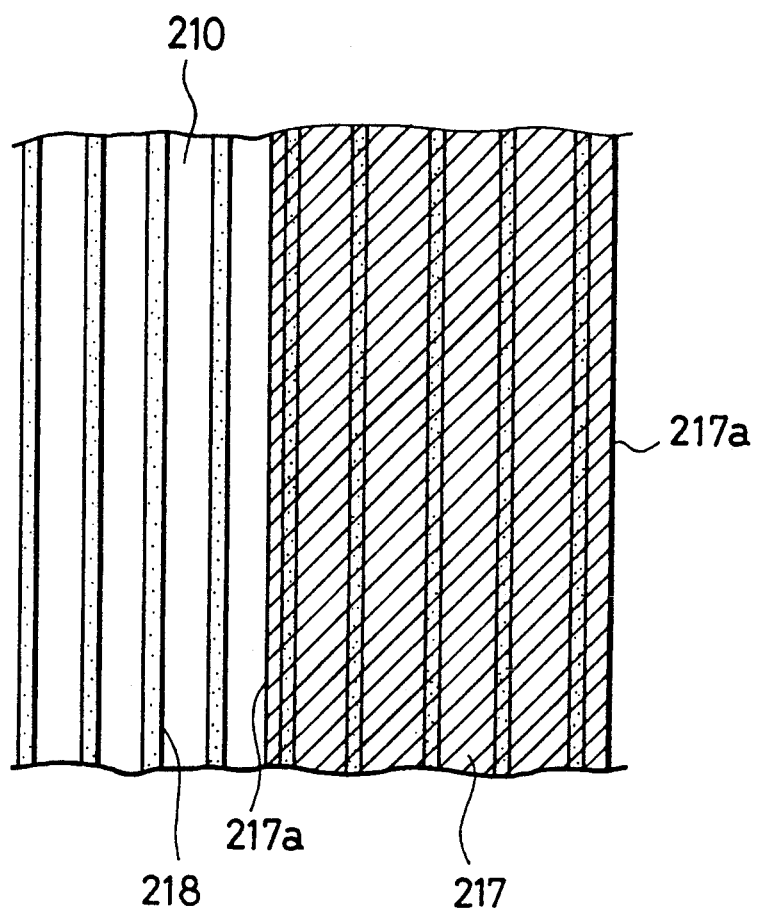
FIG. 11 is a plan view showing a photomask of another embodiment of the invention.

In the embodiment described above, the opaque stripes extend in the direction normal to the edges of the phase shifters whose image is desired to be transferred. The direction of the opaque stripes may be other than that shown in the embodiment of FIG. 8A. For instance, as illustrated in FIG. 11, opaque stripes 218 forming a light attenuator may be parallel with edges 217a of a phase shifter 217 whose image is desired to be transferred.

The light attenuator used in the above embodiment comprises an array of opaque stripes. It may alternatively comprise a thin film similar to the one described with reference to the embodiment of FIG. 4.

Figure 12A:
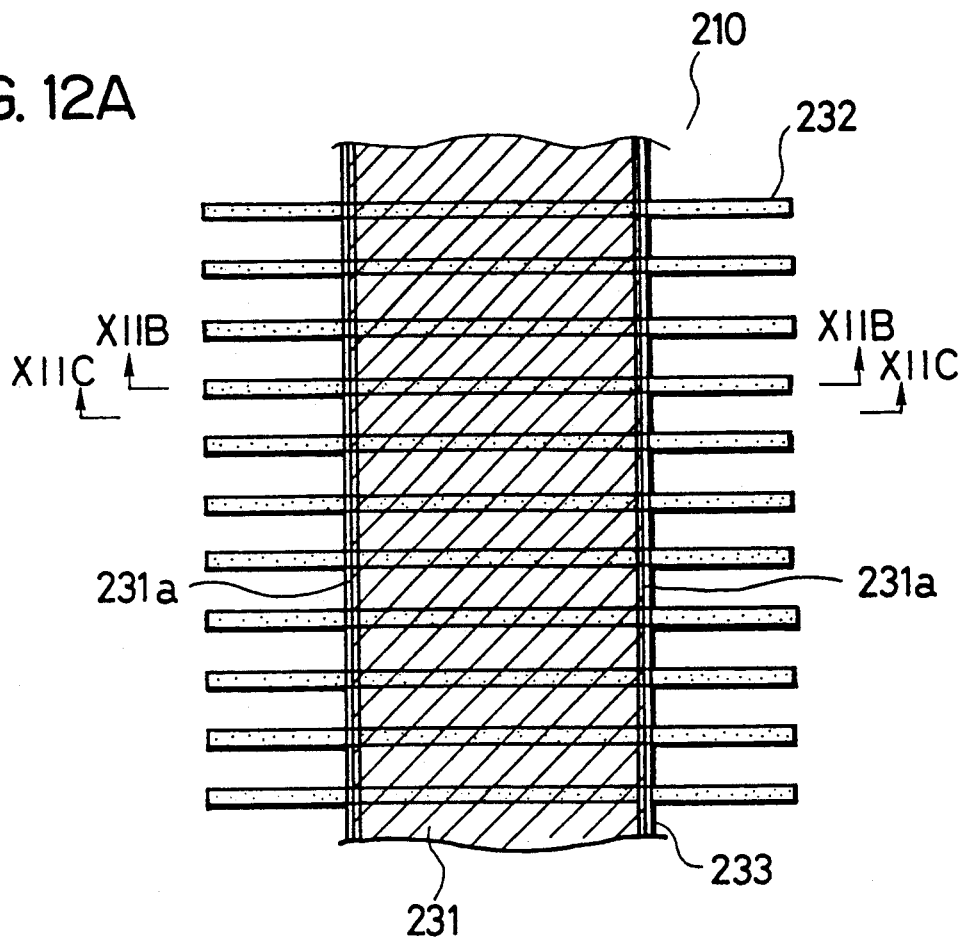
FIG. 12A is a plan view showing a photomask of another embodiment of the invention.
Figure 12B:
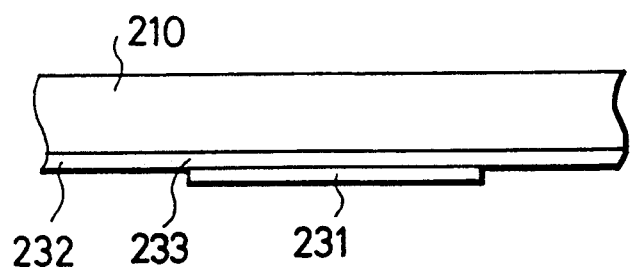
FIG. 12B is a sectional view along line XIIB—XIIB in FIG. 12A.
Figure 12C:
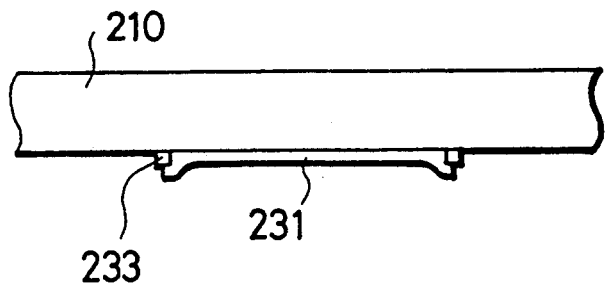
FIG. 12C is a sectional view along line XIIC—XIIC in FIG. 12A.

FIGS. 12A and 12B show part of a mask pattern used in another embodiment of the invention.

The illustrated part of the photomask of this embodiment is similar to the part of the photomask pattern of FIG. 8A having an array of opaque stripes covering the shifter edges, but is additionally provided with fine stripes along shifter edges. That is, in addition to opaque stripes 232 extending normal to edges 231a of a phase shifter 231, fine stripes 233 of chrome, for example, are provided to extend along the shifter edges 231a, being disposed below (nearer to the mask substrate 210) the phase shifter 231. The width of the fine stripe 233 is not larger than half the resolution of the optical system, i.e., 0.25×λ/NA. This fine stripe 233 gives a light intensity distribution equivalent to that given by the edge 231a of the phase shifter 231.

The use of the fine stripes 233 along the edge of the phase shifter edge 231a prevents scattering at the edge of the phase shifter, and the precision of the resultant resist pattern is further improved.

The fine stripes 233 may be formed of the same material as and at the same time as the opaque stripes 232, so the process steps of forming the photomask is not increased.

Figure 13:
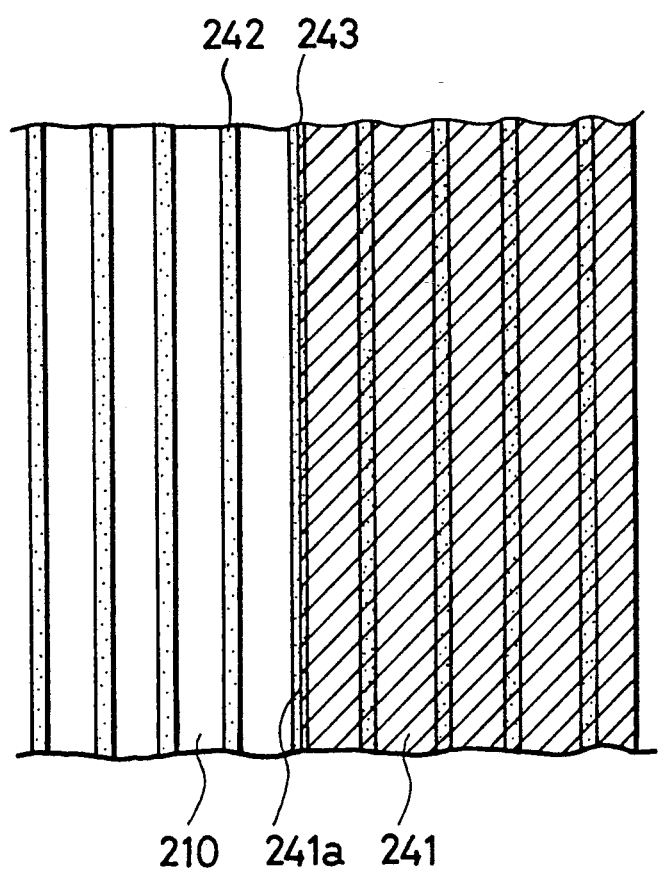
FIG. 13 is a plan view showing a photomask of another embodiment of the invention.

FIG. 13 shows a part of a mask pattern of a photomask of another embodiment of the invention.

The photomask of this embodiment is similar to the embodiment of FIG. 11, but is additionally provided with fine stripes extending along shifter edges. That is, in addition to the opaque stripes 242 extending parallel with the shifter edges 241a (only one being illustrated), fine stripes 233 (only one being illustrated) of chrome for example are provided to extend along the edges 241a of the phase shifter 241, being disposed below the phase shifter 241. The width of each stripe 243 is not larger than half the resolution of the optical system, i.e., 0.25×λ/NA. This fine stripe 243 give a light intensity distribution equivalent to that given by the edge 241a of the phase shifter 241.

The function of the fine stripe 243 is similar to that of the fine stripe 233 of the embodiment of FIGS. 12A and 12B.

In the embodiment of FIG. 13, the fine stripe 243 may be one of the stripes 242 forming the light attenuator.

Modifications described with reference to the embodiment of FIGS. 8A to 8C can be applied to the embodiments of FIGS. 11, 12A, 12B and 13.

As has been described, the lines of resist pattern with different widths can be formed through a single projection exposure step by the use of one or more light attenuators. The width of the lines of the resist pattern can be controlled by adjustment of the transparency of each light attenuator. Where the light attenuator comprises an array of opaque stripes, the transparency can be adjusted by adjustment of the width and/or pitch of the opaque stripes.

In the various embodiments described above, the pitch of the opaque stripes forming the light attenuator is not larger than the resolution of the optical system used for the projection exposure. However, it is also possible to use a pitch slightly larger than the resolution. If the pitch is larger than the resolution, the attenuation is not perfectly uniform as illustrated in FIG. 6 for the pitch of 0.6 μm. But as long as the deviation from the uniformity is small, the results may still be satisfactory.

Various embodiment described can be used in combination. For instance, the provision of arrays of stripes having different attenuation (either by the different width of the stripes or different pitch of the stripes) as taught in the embodiment of FIG. 8A may be incorporated in forming the photomask of FIGS. 1 or of 5. Similarly, the provision of fine stripes along shifter edges as taught with reference to FIGS. 12A, 12B and 13 may be incorporated in forming the photomask of FIG. 1.

As has been described, the use of the light attenuator as disclosed in connection with the various embodiments of the invention can eliminate undesired shifter edges without additional exposure steps, or to obtain lines of resist patterns having different widths.

We claim:

1. A photomask for use in forming a resist pattern by projection exposure of a resist, said photomask comprising:
    a phase shifter having an edge including a first part whose image is to be transferred and a second part whose image is not to be transferred; and
    a light attenuator covering said first part of the edge.

2. The photomask according to claim 1, wherein said light attenuator comprises an array of opaque stripes arranged at a pitch of not more than a limit which is substantially equal to the resolution of an optical system used for the projection exposure.

3. The photomask according to claim 2, wherein the stripes extend normal to said first part of the edge.

4. The photomask according to claim 2, wherein the stripes are made of chrome.

5. The photomask according to claim 1, wherein said light attenuator comprises a thin film having a transparency of less than 95%.

6. A photomask for use in forming a resist pattern by projection exposure of a resist, said photomask comprising:
   an array of opaque lines to form a line-and-space pattern;
   an array of phase shifters having first edge parts aligned with said opaque lines, said phase shifters having second edge parts not aligned with said opaque lines; and
   a light attenuator covering said first parts of the edges.

7. The photomask according to claim 6, wherein said light attenuator comprises an array of opaque stripes arranged at a pitch of not more than a limit which is substantially equal to the resolution of an optical system used for the projection exposure.

8. The photomask according to claim 7, wherein the stripes extend normal to said first edge parts.

9. The photomask according to claim 7, wherein said arrays of lines and said stripes are both made of the same material.

10. The photomask according to claim 7, wherein said light attenuator has a transparency of less than 80%.

11. The photomask according to claim 7, wherein the light transparency of said light attenuator is so determined that with the dose of exposure resulting in the line pattern of the desired width at areas corresponding to said first edge parts, transfer of the image of the second edge parts is avoided.

12. A photomask for use in forming a resist pattern by projection exposure of a resist, said photomask comprising:
   a first phase shifter edge part whose image is to be transferred to a first line of the resist;
   a second phase shifter edge part whose image is to be transferred to a second line of the resist wider than said first line; and
   a light attenuator covering said second phase shifter edge part.

13. The photomask according to claim 12, wherein said light attenuator comprises an array of opaque stripes arranged at a pitch of not more than a limit which is substantially equal to the resolution of an optical system used for the projection exposure.

14. The photomask according to claim 13, wherein the stripes extend normal to said first edge part.

15. The photomask according to claim 13, wherein the stripes are made of chrome.

16. The photomask according to claim 13, further comprising a scattering-preventing opaque stripe extending along said second shifter edge part, said scattering-preventing opaque stripe having a width of not more than another limit which is substantially equal to half the resolution of the optical system, and giving a light intensity distribution equivalent to the light intensity distribution given by said first part of the edge alone.

17. The photomask according to claim 16, wherein said scattering-preventing opaque stripe is made of chrome.

18. A photomask for use in forming a resist pattern by projection exposure of a resist, said photomask comprising:
   a first phase shifter edge part whose image is to be transferred to a first line of the resist;
   a second phase shifter edge part whose image is to be transferred to a second line of the resist wider than said first line;
   a first light attenuator covering said first phase shifter edge part; and
   a second light attenuator covering said second phase shifter edge part and having a lower transparency than said first light attenuator.

19. The photomask according to claim 18, wherein said first and second light attenuators comprise an array of opaque stripes arranged at a pitch of not more than a limit which is substantially equal to the resolution of an optical system used for the projection exposure.

20. The photomask according to claim 19, wherein said opaque stripes forming said first and second attenuators are arranged at the same pitch, the opaque stripes forming said second attenuator are wider than the opaque stripes forming said first light attenuator.

21. The photomask according to claim 19, wherein said opaque stripes forming said first and second attenuators are of the same width, and the opaque stripes forming said second attenuator are arranged at a shorter pitch than the opaque stripes forming said first light attenuator.

22. The photomask according to claim 19, wherein the stripes extend normal to said first and second edges parts.

23. The photomask according to claim 10, wherein the stripes are made of chrome.

24. The photomask according to claim 19, further comprising a scattering-preventing opaque stripe extending along said first part of the edge, said scattering-preventing opaque stripe having a width of not more than another limit which is substantially equal to half the resolution of the optical system, and giving a light intensity distribution equivalent to the light intensity distribution given by said first part of the edge alone.

25. The photomask according to claim 24, wherein said scattering-preventing opaque stripe is made of chrome.

26. A method of forming a resist pattern by projection exposure of a resist, comprising the steps of:
   providing a photomask including a phase shifter having an edge including a first part whose image is to be transferred and a second part whose image is not to be transferred, and a light attenuator covering said first part of the edge; and
   performing projection exposure through said photomask.

27. The method according to claim 26, wherein said light attenuator comprises an array of opaque stripes arranged at a pitch of not more than a limit which is substantially equal to the resolution of an optical system used for the projection exposure.

28. The method according to claim 27, said step of providing the photomask comprises adjusting the pitch of the opaque stripes for control of the transparency of the light attenuator.

29. The method according to claim 27, said step of providing the photomask comprises adjusting the width of the opaque stripes for control of the transparency of the light attenuator.

30. The method according to claim 26, wherein said light attenuator comprises a thin film, and said step of providing the photomask comprises adjusting the thickness of the thin film for control of the transparency of the light attenuator.

31. A method of forming a resist pattern by projection exposure of a resist, comprising the steps of:
providing a photomask including an array of opaque lines to form a line-and-space pattern, an array of phase shifters having first edge parts aligned with said opaque lines, said phase shifters having second edge parts not aligned with said opaque lines, and a light attenuator covering said first parts of the edges; and
performing projection exposure through said photomask.

32. The method according to claim 31, wherein said light attenuator comprises an array of opaque stripes arranged at a pitch of not more than a limit which is substantially equal to the resolution of an optical system used for the projection exposure.

33. The method according to claim 32, said step of providing the photomask comprises forming said arrays of lines and said stripes at the same step.

34. The method according to claim 31, wherein said step of providing the photomask comprises adjusting the light transparency of said light attenuator such that, during the projection exposure, with the dose of exposure resulting in the line pattern of the desired width at areas corresponding to said first edge parts, transfer of transfer of the second edge parts is avoided.

35. A method of forming a resist pattern by projection exposure of a resist, comprising the steps of:
providing a photomask including a first phase shifter edge part whose image is to be transferred to a first line of the resist, a second phase shifter edge part whose image is to be transferred to a second line of the resist wider than said first line and a light attenuator covering said second phase shifter edge part; and
performing projection exposure through said photomask.

36. The method according to claim 35, wherein said light attenuator comprises an array of opaque stripes arranged at a pitch of not more than a limit which is substantially equal to the resolution of an optical system used for the projection exposure.

37. The method according to claim 36, said step of providing the photomask comprises adjusting the pitch of the opaque stripes for control of the width of said second line.

38. The method according to claim 36, said step of providing the photomask comprises adjusting the pitch of the opaque stripes for control of the width of said second line.

39. A method of forming a resist pattern by projection exposure of a resist, comprising the steps of:
providing a photomask including a first phase shifter edge part whose image is to be transferred to a first line of the resist, a second phase shifter edge part whose image is to be transferred to a second line of the resist wider than said first line, a first light attenuator covering said first phase shifter edge part, and a second light attenuator covering said second phase shifter edge part and having a lower transparency than said first light attenuator; and
performing projection exposure through said photomask.

40. The method according to claim 39, wherein said first and second light attenuators comprise an array of opaque stripes arranged at a pitch of not more than a limit which is substantially equal to the resolution of an optical system used for the projection exposure.

41. The method according to claim 40, wherein said step of providing the photomask comprises setting the pitch of said opaque stripes forming said first and second attenuators at the same value, and setting the width of the opaque stripes forming said second attenuator at a larger value than the width of the opaque stripes forming said first light attenuator.

42. The method according to claim 40, wherein said step of providing the photomask comprises setting the width of the opaque stripes forming said first and second attenuators at the same value, and setting the pitch of the opaque stripes forming said second attenuator at a smaller value than the pitch of the opaque stripes forming said first light attenuator.

43. The method according to claim 40, said step of providing the photomask comprises adjusting the pitch of the opaque stripes for control of the width of said first and second lines.

44. The method according to claim 40, said step of providing the photomask comprises adjusting the pitch of the opaque stripes for control of the width of said first and second lines.

* * * * *